United States Patent
Sakuragi

Patent Number: 6,002,081
Date of Patent: Dec. 14, 1999

[54] THERMOELECTRIC COMPONENT AND THERMOELECTRIC COOLING DEVICE

[75] Inventor: Shiro Sakuragi, Ibaragi, Japan

[73] Assignee: S.E.L. USA Inc., Palisades Park, N.J.

[21] Appl. No.: 08/888,467

[22] Filed: Jul. 7, 1997

[51] Int. Cl.⁶ .................................................. H01L 35/28
[52] U.S. Cl. .......................................................... 136/203
[58] Field of Search .................................. 136/203, 223, 136/222, 209, 200; 62/3.2

[56] References Cited

U.S. PATENT DOCUMENTS

| | | | |
|---|---|---|---|
| 4,497,973 | 2/1985 | Heath et al. | 136/212 |
| 4,902,648 | 2/1990 | Ohta et al. | 437/247 |
| 4,907,060 | 3/1990 | Nelson et al. | 357/72 |
| 5,228,923 | 7/1993 | Hed | 136/208 |
| 5,362,983 | 11/1994 | Yamamura et al. | 257/414 |
| 5,409,547 | 4/1995 | Watanabe et al. | 136/204 |
| 5,441,576 | 8/1995 | Bierschenk et al. | 136/203 |
| 5,470,395 | 11/1995 | Yater et al. | 136/203 |
| 5,712,448 | 1/1998 | Vandersande et al. | 136/203 |
| 5,715,684 | 2/1998 | Watanabe et al. | 62/3.2 |
| 5,817,188 | 10/1998 | Yahatz et al. | 136/237 |

FOREIGN PATENT DOCUMENTS

| | | |
|---|---|---|
| 0795630A1 | 9/1997 | European Pat. Off. . |
| 1357234 | 2/1964 | France . |
| 1253292 | 11/1967 | Germany . |
| 004006861A1 | 9/1991 | Germany . |
| 0256180 | 10/1989 | Japan . |
| 406174329 | 6/1994 | Japan . |
| 1042512 | 9/1966 | United Kingdom . |

*Primary Examiner*—Kathryn Gorgos
*Assistant Examiner*—Erica Smith-Hicks
*Attorney, Agent, or Firm*—White & Case L.L.P.

[57] ABSTRACT

A thermoelectric component is provided. The component comprises a partition plate with electrical insulation, P-type and n-type thermoelectrical semiconductor elements that are equal in number and retained with juts in the partition plate, flat metallic electrodes connected to the cold junction of the p-type and n-type thermoelectric semiconductor elements, and T-shaped metallic electrodes connected to the hot junction of the p-type and n-type thermoelectric semiconductor elements.

8 Claims, 9 Drawing Sheets

THERMOELECTRIC COMPONENT AND THERMOELECTRIC COOLING DEVICE

BACKGROUND OF THE INVENTION

1. Field of the Invention

This invention is related to thermoelectric components and cooling devices utilizing thermoelectric semiconductor elements. In detail, it is related to the technology which enables thermoelectric elements to last longer while preventing the cooling efficiency from decreasing.

2. Description of the Prior Art

Thermoelectric components utilizing thermoelectric semiconductor elements made of such compounds as bismuth/tellurium, iron/silicon or cobalt/antimony group are used in cooling/heating devices. These thermoelectric components, where neither liquid nor gas is used, are useful as cooling/heating sources which are compact, free from rotational abrasion and require no maintenance.

Generally, in this type of thermoelectric component, two types of thermoelectric semiconductor elements, p-type and n-type, are arranged precisely. The thermoelectric semiconductor elements are soldered to electrodes and form a π-type series circuit. When these thermoelectric elements and metallic electrodes are sandwiched by ceramic substrates with metallic film, they are commonly used as thermoelectric modules.

The composition of thermoelectric modules conventionally known is shown in FIG. 7, where (a) is the front view and (b) the diagonal view. As is shown in this figure, in this thermoelectric module, n-type and p-type thermoelectric semiconductor elements are positioned alternatively and attached to metallic electrodes. The metallic electrodes are attached alternatively to the top and bottom of the n-type and p-type thermoelectric semiconductor elements, and all elements are thus connected in a series circuit. In order to fix thermoelectric elements to upper and lower metallic electrodes, solder is applied. Each of the upper and lower metallic electrodes is attached to ceramic substrates which have been metalized with copper or nickel, and the entire system is thereby secured. The thermoelectric component of this type of composition is generally called a thermoelectric module.

When power is supplied to the electrodes of this thermoelectric module to allow an electric current to run from n-type element to p-type element, heat absorption (cold junction) occurs at the upper part of the π-type and heat radiation (hot junction) at the lower part because of the Peltier effect. When the electrodes are connected in reverse, the directions of hot and cold junctions also switch. This phenomenon makes thermoelectric components useful in cooking/heating devices. Thermoelectric modules are of wide use; cooling LSIs, computer CPUs and laser units as well as for refrigeration.

When we use this thermoelectric component as a cooling device, we need to cool the hot junction (radiation part). Traditionally there have been two approaches to cooling thermoelectric components. One is, as shown in FIG. 8(a), the air cooling system in which Radiating Fin 32 is attached to the hot junction of Thermoelectric Component 31 so that air is sent from Fan 33 to Radiating Fin 32. The other is, as shown in FIG. 8(b), the water cooling system in which a Water Cooling Jacket 34 is attached to the hot junction of Thermoelectric Component 31 so that cooling water runs through the Water Cooling Jacket 34 in the direction of the arrows shown between points 34A and 34B.

FIG. 9 is a temperature diagram of a thermoelectric component. The parameters which evaluate the cooling capacity of the thermoelectric component are Module ΔT and System ΔT. Module ΔT is the difference (ΔT1) between the temperature at the outer edge of the cold junction of the thermoelectric component, that is, the temperature (Q2) of the upper ceramic substrate, and the temperature at the outer edge of the hot junction of the thermoelectric component, that is, the temperature (Q5) of lower ceramic substrate. System ΔT is the difference (ΔT2) between the temperature (Q3) of the cold-junction part of the thermoelectric component and the one (Q6) surrounding its hot-junction part. The latter perimeter temperature corresponds to the temperature around Radiating Fin 32 in FIG. 8(a) and to the temperature of water in Water Cooling Jacket 34 in FIG. 8(b).

As illustrated in FIG. 9, the lowest temperature of the thermoelectric component is measured at the edge of the cold junction of the thermoelectric semiconductor element. The temperature rises as the measuring point moves through the metallic electrode to the ceramic substrate and ends up at Q3 at the cooling load. The highest temperature (Q4) is measured at the edge of the hot junction of the thermoelectric semiconductor element. The temperature falls as the measuring point moves through the metallic electrode to the ceramic substrate and ends up at Q6 around the hot junction. Owing to a small thermo-conductivity, ceramic substrates lower the cooling efficiency significantly.

The Peltier cooling device is therefore suggested as preventing the cooling efficiency from decreasing (Nikkei Mechanical, pp 48–56, Sep. 16, 1996). In this device, aluminum substrates with the oxidized surface, are used instead of ceramic ones. It also has a water cooling jacket with a spraying nozzle which can cool the aluminum substrate at the hot junction efficiently. This Peltier cooling device is said to provide the same cooling efficiency as that of an ordinary cooling system with flon gas.

However, this Peltier cooling device and the cooling devices shown in FIG. 8, do not provide the optimum performance from thermoelectric semiconductor elements because thermoelectric semiconductor elements are cooled indirectly through a lower substrate in each of them.

The thermoelectric semiconductor elements shown in FIG. 7 receive a large amount of thermal stress during operation, owing to the stiff structure in which the elements are fixed on top and bottom to the ceramic substrates. This results in a short life of thermoelectric semiconductor elements.

SUMMARY OF THE INVENTION

The purpose of the present invention is to draw forth the capacity of thermoelectric semiconductor elements at its maximum by minimizing interference on the cooling efficiency. In order to do so, direct cooling of thermoelectric semiconductor elements and metallic electrodes at the hot junction is employed. The invention also has the aim to lengthen the life of thermoelectric semiconductor elements by relieving thermal stress on them.

A thermoelectric component of this invention is characterized by the following structural members:

A partition plate with electrical insulation;

P-type and n-type thermoelectric semiconductor elements that are equal in number and retained with juts in the partition plate;

Flat metallic electrodes connected to the cold junction of the p-type and n-type thermoelectric semiconductor elements; and, T-shaped metallic electrodes connected to the hot junction of the p-type and n-type thermoelectric semiconductor elements.

The thermoelectric cooling device of this invention is characterized by a cooling container which houses the hot junction side of the thermoelectric component below the partition plate.

In the thermoelectric component of this invention, thermal stress on the thermoelectric semiconductor elements is relieved because both flat metallic and T-shaped metallic electrodes are not connected to ceramic substrates. The thermoelectric cooling device of this invention can minimize the lowering of cooling efficiency by direct cooling of the hot junction side below the partition plate within the cooling container; that is, the juts of p-type and n-type thermoelectric semiconductor elements on the radiating side and T-shaped metallic electrodes attached to their end.

DETAILED DESCRIPTION OF THE PREFERRED EMBODIMENT

Figure 1A:
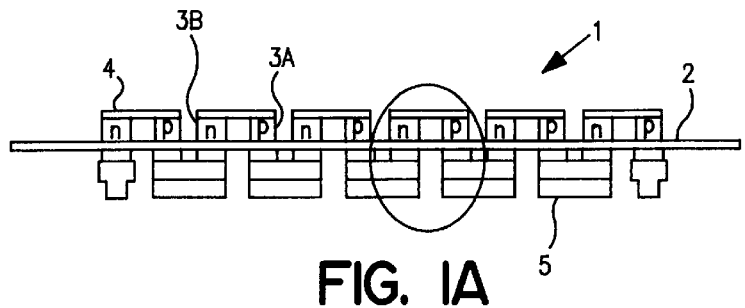
FIG. 1(a) is a front view of thermoelectric component of the invention.

The description of this invention in detail is to follow referring to attached figures. FIG. 1(a) is a front view of thermoelectric component which employs this invention. This Thermoelectric component 1 is characterized in structure that P-Type Thermoelectric Semiconductor Element 3A and N-Type 3B jut out of and retained by Partition Plate 2. By low temperature solder such as bismuth-tin alloy, Copper Electrode 4 is attached to the upper side of P-Type Thermoelectric Semiconductor Element 3A and N-Type 3B, while T-Shaped Copper Electrode 5 is attached to the lower side. It is one of the characteristics of this invention that the copper electrode at the lower side of thermoelectric semiconductor element is shaped into "T". Another characteristic is that ceramic substrates are not used at the top of Copper Electrode 4 or at the bottom of T-shaped Copper Electrode 5.

The Partition Plate 2 is, for example, 0.2–0.5 mm thick and made of an electrical insulation material such as an epoxide glass board or an anodized aluminum board. The P-Type Thermoelectric Semiconductor Element 3A and N-Type 3B are made of a single crystal semiconductor such as bismuth-tellurium with a small cross section of 1.5–2 $mm^2$, for example. They are built into Partition Plate 2 with 0.2–0.3 mm jutting out below and retained by the plate. The process of manufacturing this type of thermoelectric component in which thermoelectric semiconductor elements are built into a partition plate is explained in detail in Patent Application Heisei 7-276751 (Patents Disclosure Heisei 8-2228027), and therefore it is not repeated here.

Figure 1B:
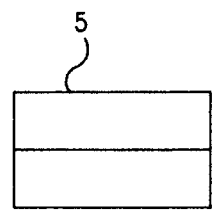
FIG. 1(b) is an enlarged front view of the T-shaped Copper Electrode 5 shown in FIG. 1(a).
Figure 1C:
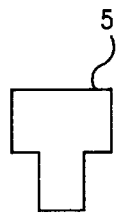
FIG. 1(c) an enlarged bottom view of the T-shaped Copper Electrode 5 shown in FIG. 1(a).
Figure 1D:
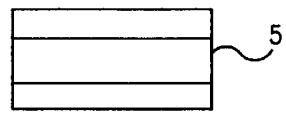
FIG. 1(d) is an enlarged side view of the T-shaped Copper Electrode 5 shown in FIG. 1(a).

FIG. 1(b) is an enlarged front view of the T-shaped Copper Electrode 5 shown in FIG. 1(a), while FIG. 1(d) is an enlarged side view and FIG. 1(c) an enlarged bottom view. All of the T-shaped copper electrodes shown in FIG. 1, which number seven, are identical in shape and size. Two of them at the ends are attached to appear as shown in FIG. 1(c), while the other five electrodes as shown FIG. 1(b). It would be appropriate to plate these T-shaped Copper Electrodes 5 with nickel or tin, because they are installed in water.

Figure 1E:
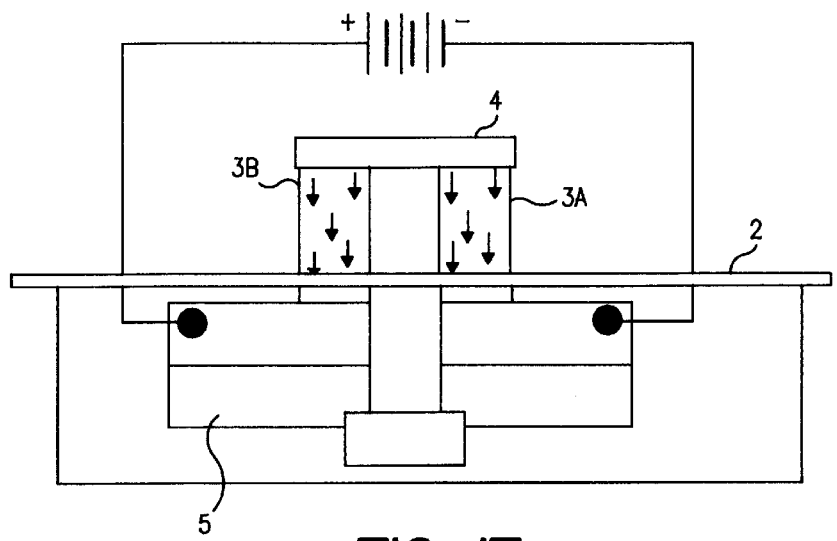
FIG. 1(e) is an enlargement of the circled portion in FIG. 1(a).

FIG. 1(e) is an enlargement of the circled portion in FIG. 1(a), which is useful in explaining the operation of the thermoelectric component. As shown in this figure, when a thermoelectric component as shown in FIG. 1(a) is in operation, the juts of P-Type Thermoelectric Semiconductor Elements 3A and N-Type Thermoelectric Semiconductor Elements 3B under Partition Plate 2 and T-shaped Copper Electrodes 5 touch gas or liquid such as air or water directly, in which heat is removed. The longer the T-shaped Copper Electrodes 5 are, the higher the heat exchange efficiency is. However, the weight and cost also increases, and therefore, in this example the length is made at approximately 5 mm.

FIG. 2 shows a cooling system with a thermoelectric component of this invention. Figure (a) shows an air cooling system while Figure (b), a water cooling system. The numbering system is the same for the corresponding parts as in FIG. 1.

Figure 2A:
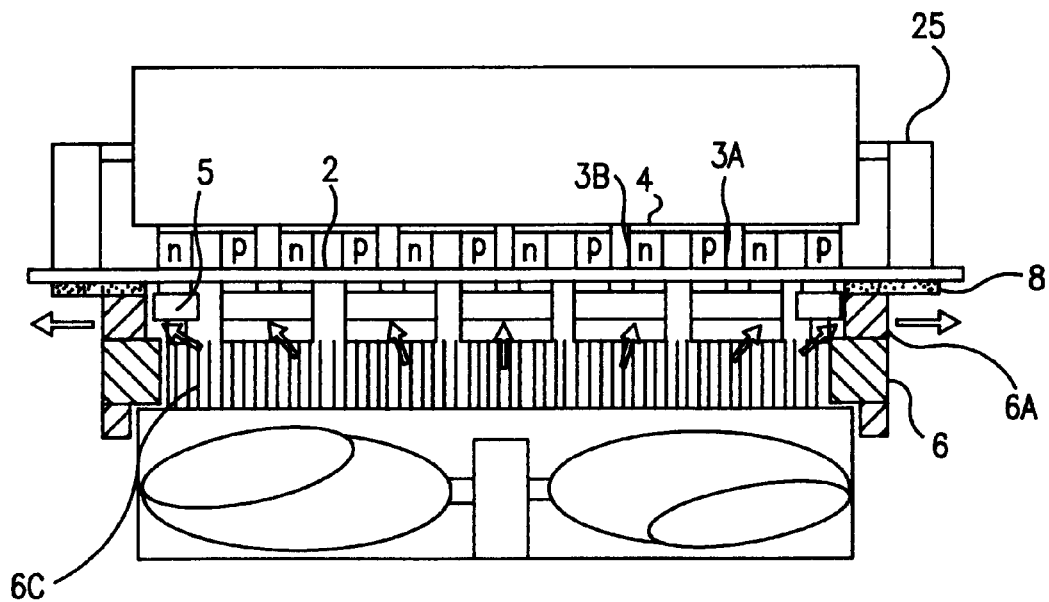
FIG. 2(a) shows an air cooling system for the thermoelectric component of the invention.

In the air cooling system shown in FIG. 2(a), the Air Cooling Jacket 6 is attached to the lower side of the thermoelectric component, and air is sent by Fan 7 from the bottom of Air Cooling Jacket 6. The bottom of Air Cooling Jacket 6 has vents (not shown in the figure) or something of that nature through which air sent by Fan 7 passes. Air Cooling Jacket 6 is made of an anodized aluminum. Inside of Air Cooling Jacket 6, Ventilation/Supporting Member 6c is installed to support T-shaped Copper Electrodes 5 from underneath their bottom and to supply T-shaped copper electrodes with air sent by Fan 7. This Ventilation/Supporting Member 6c is made of plastic and formed into a drainboard or screen. Air Cooling Jacket 6 has Air Exit 6A at both top ends. The top edge of Air Cooling Jacket 6 is attached to Partition Plate 2 by an Adhesive Seal 8.

With this structure, air sent by Fan 7 passes through the bottom of Air Cooling Jacket 6 and the Ventilation/Supporting member 6c and hits the T-shaped Copper Electrodes 5. The air passes between the sides of the T-shaped Copper Electrodes 5, flows inside the Air Cooling Jacket 6 and out of Air Exit 6A. Thanks to the space along the vertical line of the "T" among the T-shaped Copper Electrodes 5, air can now flow smoothly.

Figure 2B:
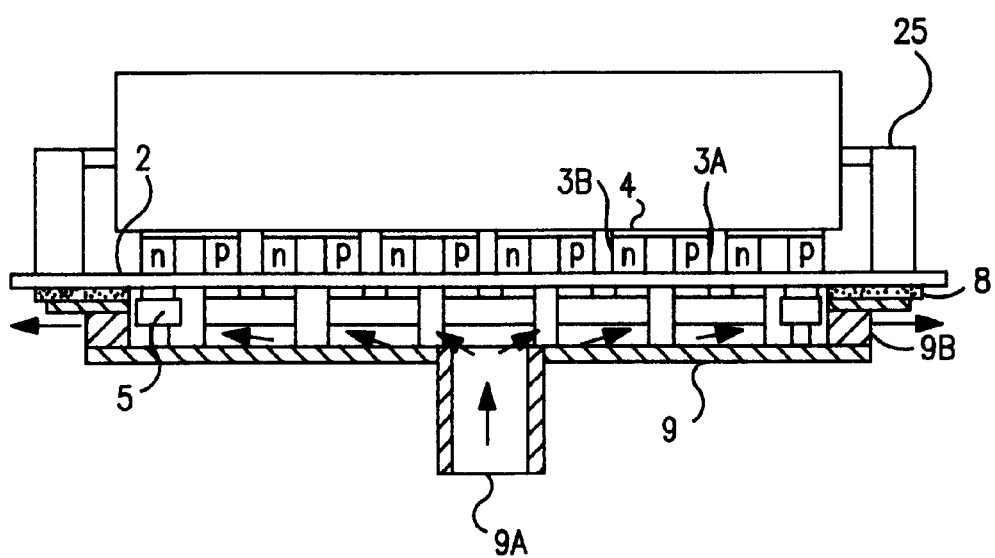
FIG. 2(b) shows a water cooling system for the thermoelectric component of the invention.

In the liquid cooling system shown in FIG. 2(b), the Liquid Cooling Jacket 9 is attached to the lower side of the thermoelectric component. The Liquid Cooling Jacket 9 is made of an anodized aluminum, and it has Liquid Entrance 9A in the center of its bottom and Liquid Exits 9B at its top ends. The top edge of Liquid Cooling Jacket 9 is attached to Partition Plate 2 by an Adhesive Seal 8. The inside bottom of Liquid Cooling Jacket 9 touches the bottom of T-shaped Copper Electrodes 5.

When water or an organic refrigerant, for example, a coolant composed of ethylene glycol, is sent from the Liquid Entrance 9A into the Liquid Cooling Jacket 9, the coolant flows inside of the Liquid Cooling Jacket 9, passing through both sides of the T-shaped copper Electrodes 5 and out of Liquid Exits 9B. The coolant diffuses more when it is poured in from the bottom than poured in from the side. The space around the narrow vertical line of the "T" among the T-shaped Copper Electrodes 5 allows the coolant to flow smoothly. Although the vertical narrow leg of T-shaped copper electrodes is rectangular parallel-piped in FIG. 1, the corners can be rounded or cylinders can be used instead of a rectangular solid for a smoother flow of coolant. It also applies to FIG. 2(a).

Because the cooling load touches Copper Electrodes 4 directly, as shown in FIGS. 2(a) and (b), it is made of a material which has a large thermal conductivity and electrical insulation; for example, an anodized aluminum. A damp-proof resin frame 25 is installed around the cooling load and fixed by an adhesive seal.

Figure 3:
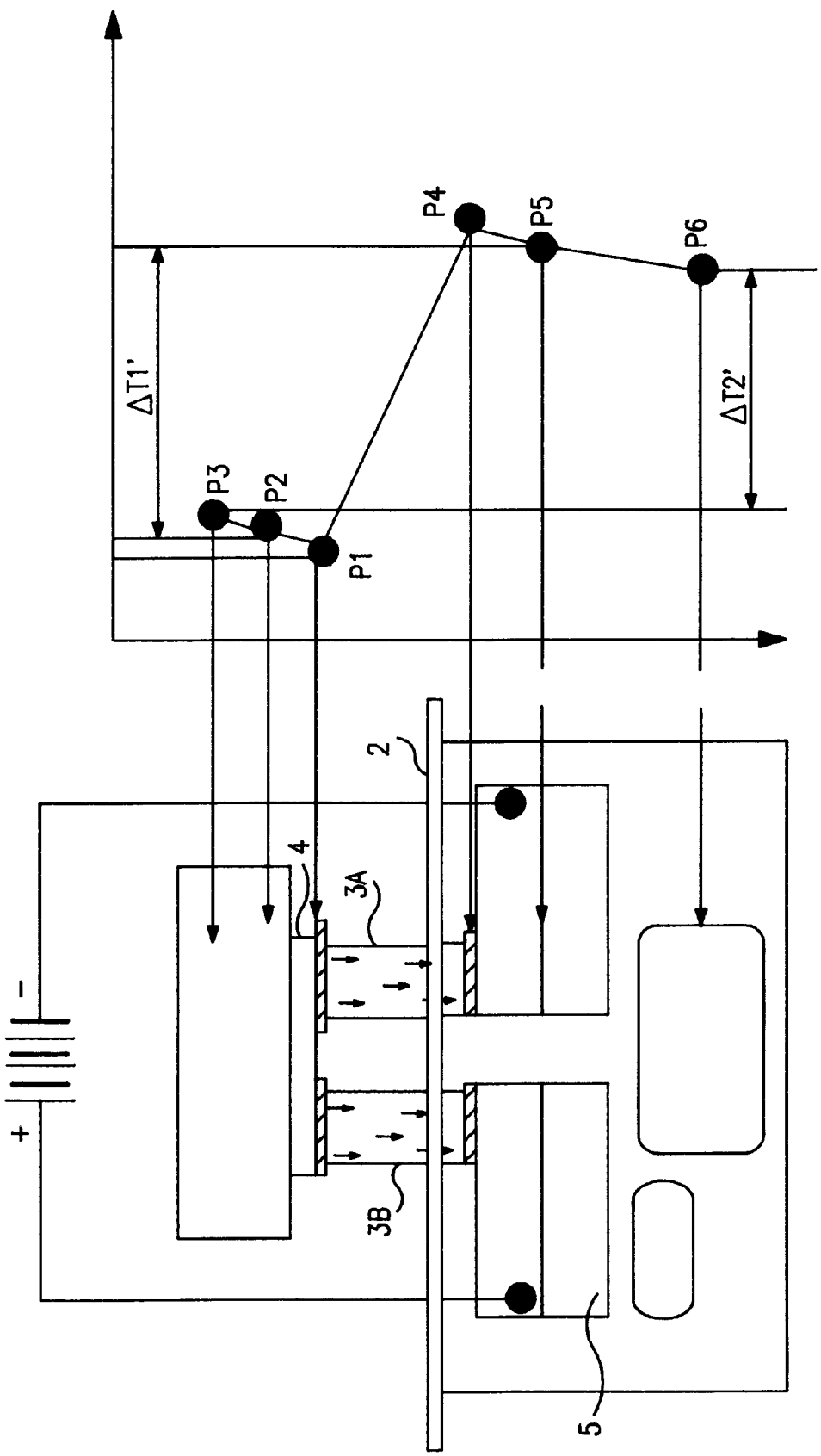
FIG. 3 shows the temperature diagram of the thermoelectric components of the invention.
Figure 4A:
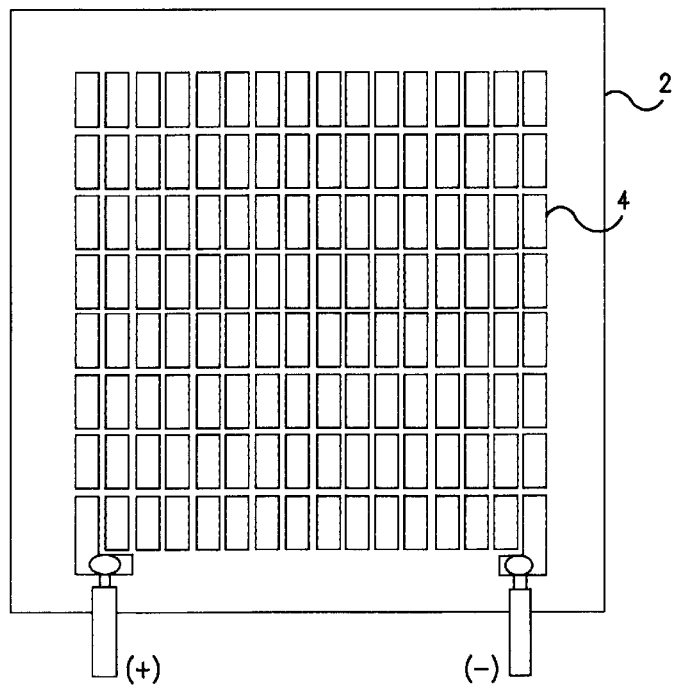
FIG. 4(a) is a plane view of an example of the thermoelectric component of the invention.
Figure 4B:
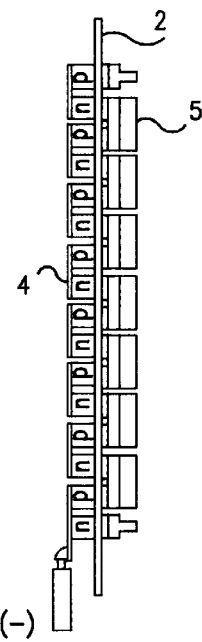
FIG. 4(b) is a right-side view of the thermoelectric component shown in FIG. 4(a).
Figure 4C:
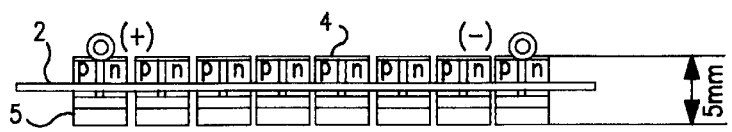
FIG. 4(c) is a front view of the thermoelectric component shown in FIG. 4(a).
Figure 4D:
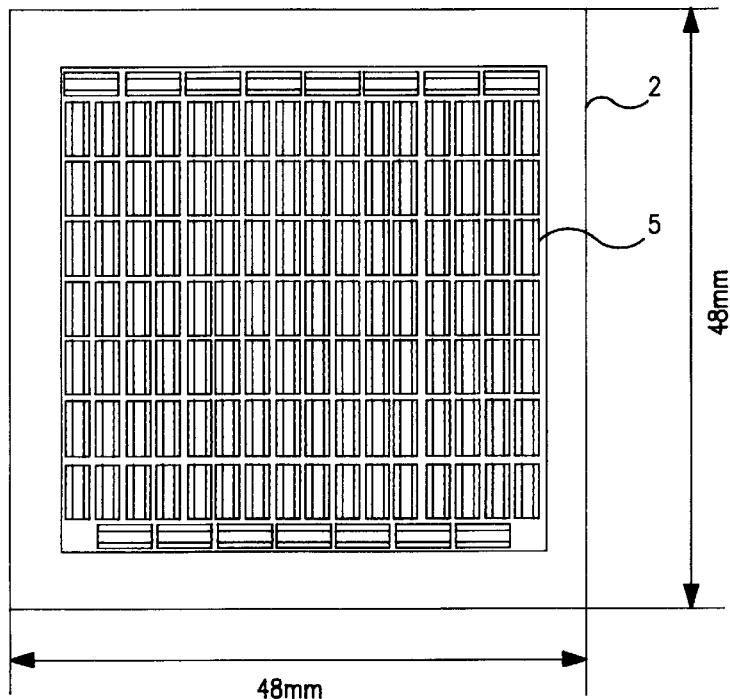
FIG. 4(d) is a bottom view of the thermoelectric component shown in FIG. 4(a).

FIG. 3 shows the temperature diagram of the thermoelectric components of this invention. In this figure, Module $\Delta T$ is the difference ($\Delta T1'$) between the temperature (P2) of the lower part of the cold junction and that (P5) of the T-shaped Copper Electrodes 5. System $\Delta T$ is the difference ($\Delta T2'$) between the temperature of the upper cold junction (P3) and the temperature around the hot junction. The cold junction refers to Cooling Load in FIG. 2, and the temperature around the hot junction refers to the air temperature inside the Air Cooling Jacket 6 in FIG. 2(a) and the liquid temperature inside Liquid Cooling Jacket 9 in FIG. 2(b).

Figure 9:
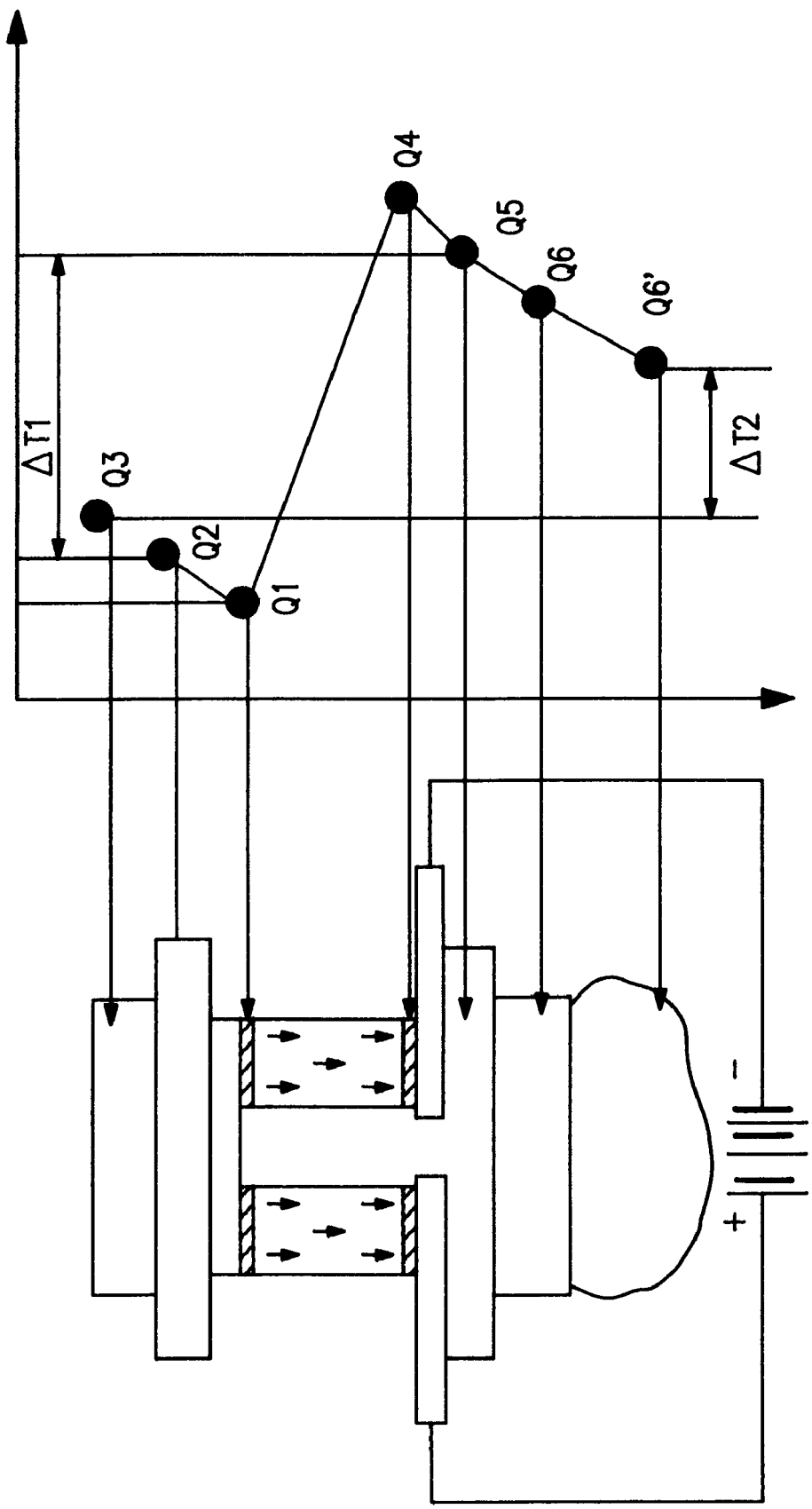
FIG. 9 is a temperature diagram of a conventional thermoelectric component.

As described, there is no ceramic substrate of a small thermal conductivity existing in the cold junction of this example of the invention. The cooling load is therefore in direct contact with the Copper Electrodes 4. Similarly, there is no ceramic substrate of a small thermal conductivity existing in the hot junction, and the T-shaped Copper Electrodes 5 are in direct contact with the cooling medium such as air or liquid. Therefore, comparing FIG. 3 with FIG. 9, it is found that $\Delta T1' > \Delta T1$ and $\Delta T2' > \Delta T2'$. This means that the thermoelectric component of this invention has a higher cooling efficiency than the conventional one both as a module and as a cooling device.

FIG. 4 is an example of the thermoelectric component of this invention. In this figure, (a) is a plane view, (b) a right side view, (c) a front view, and (d) a bottom view. The numbering is the same for the corresponding parts as in FIG. 1.

This thermoelectric component has 128 (=16×8) Copper Electrodes 4 on the upper side of the Partition Plate 2 of 48 mm×48 mm, and 127 T-shaped Copper Electrodes 5 on the lower side. One upper Copper Electrode 4 each at both ends of the front row is shaped into an L to attach terminals to affect direct-current power supply.

FIG. 5 is an example of a liquid cooling type of thermoelectric cooling unit where (a) is a plane view, (b) a sectional view at A–A' in (a), (c) a sectional view at B–B' in (a), and (d) a bottom view. Here the thermoelectric component has the same numbering as in FIG. 1.

This thermoelectric cooling unit of liquid cooling type has a Rectangular Baseboard 10 on the lower side and a Rectangular Aluminum Heat Absorbing Block 11, which are placed together by Resin Bolts 12 with heat insulation at eight locations in the perimeter. A thermoelectric component is located in the center between the two. Although a spring washer is used with the Resin Bolt 12 in this drawing, it is not necessary. Silicon-grease or gel insulator is applied to the contact plane of Copper Electrode 4 and Aluminum Heat Absorbing Block 11, and between T-shaped Copper Electrodes 5 and Baseboard 10.

Baseboard 10 and Aluminum Heat Absorbing Block 11 are made of anodized aluminum, because they have contact with the T-shaped Copper Electrodes 5 and Copper Electrodes 4 respectively. Baseboard 10 has a Liquid Entrance 10A in the center at the bottom and two Liquid Exits 10B at the bottom facing the end rows of the thermoelectric elements.

In the upper center of Baseboard 10, a pit with a flat bottom is formed to house the lower part of thermoelectric elements below Partition Plate 2. The lower ends of the T-shaped Copper Electrodes 5 are supported by the bottom of this pit. Aligned with Liquid Entrance 10A, a Groove 10D which is narrower than the width of the T-shaped Copper Electrodes 5 (horizontal width viewed from front) is formed in the pit to support T-shaped Copper Electrodes 5 as well as to allow coolant to flow in the horizontal direction as shown in the direction indicated in FIG. 5(d). Aligned with two Liquid Exits 10B respectively, grooves 10E are also formed in the pit.

A groove is formed outside the pit in Baseboard 10 to put in Adhesive 15. Upon filling Adhesive 15 into this groove, Partition Plate 2 for thermoelectric elements is placed on top and bonded.

Another groove is formed outside the groove for adhesive to place in Rubber Ring 13 and Insulator 14. In the Aluminum Heat Absorbing Block 11 on its face to the groove, a corresponding groove is formed to also place in Rubber Ring 13 and Insulator 14. Rubber rings are inserted into the upper and lower grooves respectively, and then Insulator 14 is inserted between them. Insulator 14 is made in advance of ceramics or plastic formed to fit the geometry of the groove in advance.

In an actual system, this thermoelectric cooling unit of a liquid cooling type is connected to a pump, radiator, and fan to operate.

Figure 5A:
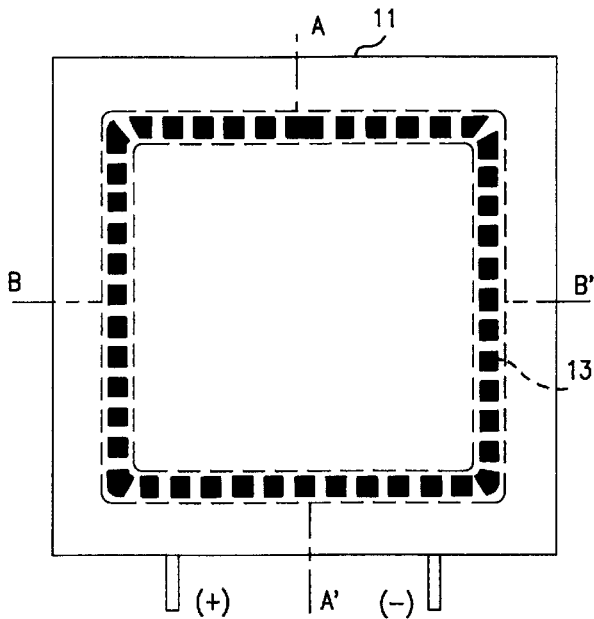
FIG. 5(a) is a plane view of a liquid cooling type of thermoelectric cooling unit of the invention.
Figure 5B:
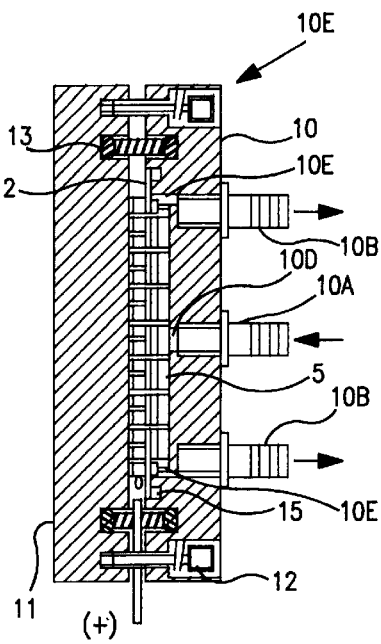
FIG. 5(b) is a sectional view along line A–A' of FIG. 5(a).
Figure 5C:
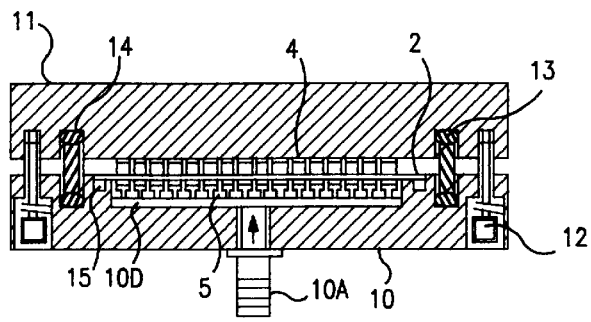
FIG. 5(c) is a sectional view along line B–B' of FIG. 5(a).
Figure 5D:
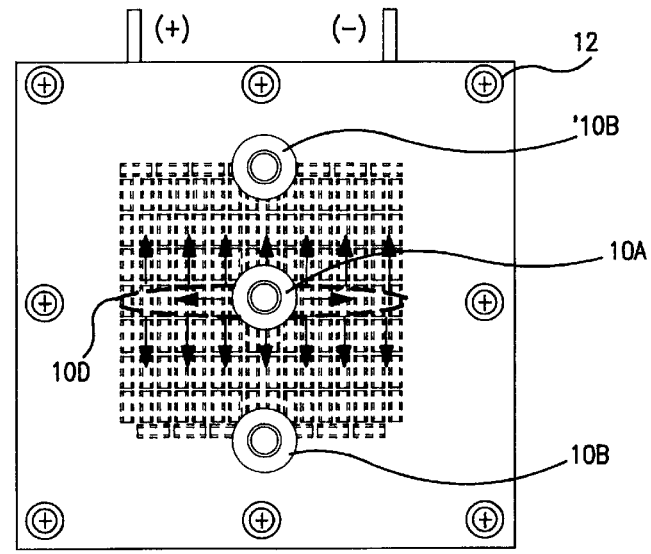
FIG. 5(d) is a bottom view of the liquid cooling type of thermoelectric cooling unit shown in FIG. 5(a).

In the thermoelectric cooling unit of the liquid cooling type structure as described, the coolant is supplied into the pit in Baseboard 10 from the Liquid Entrance 10A and flows horizontally along Groove 10D as in FIG. 5(d) as well as horizontally in the direction perpendicular to 10D as shown in FIG. 5(d) along the T-shaped Copper Electrodes 5. It then goes through 10E, eventually flowing out from the two Liquid Exits 10B.

In the thermoelectric cooling unit, the exterior of the thermoelectric elements is protected by Insulator 14 and the space between Baseboard 10 and the Aluminum Heat Absorbing Block 11 is fixed by Resin Bolt 12 of high thermal insulation value. Thus a reverse thermal movement from Baseboard 10 to Aluminum Heat Absorbing Block 11 is prevented, and the thermoelectric component is made damp-proof.

The number of Liquid exits 10B may be changed to four or six from the two employed in this particular thermoelectric cooling unit of a liquid cooling type.

Figure 6A:
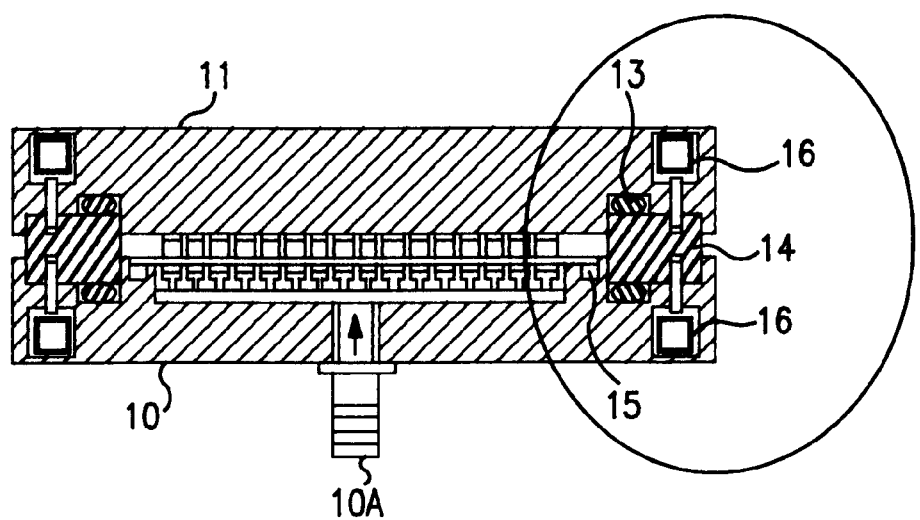
FIG. 6(a) shows another example of a liquid-cooling-type thermoelectric cooling unit of the invention, in which the connection between Baseboard 10 and the Aluminum Heat Absorbing Block 11 where the unit is fixed from both sides with Metallic Bolts 16.
Figure 6B:
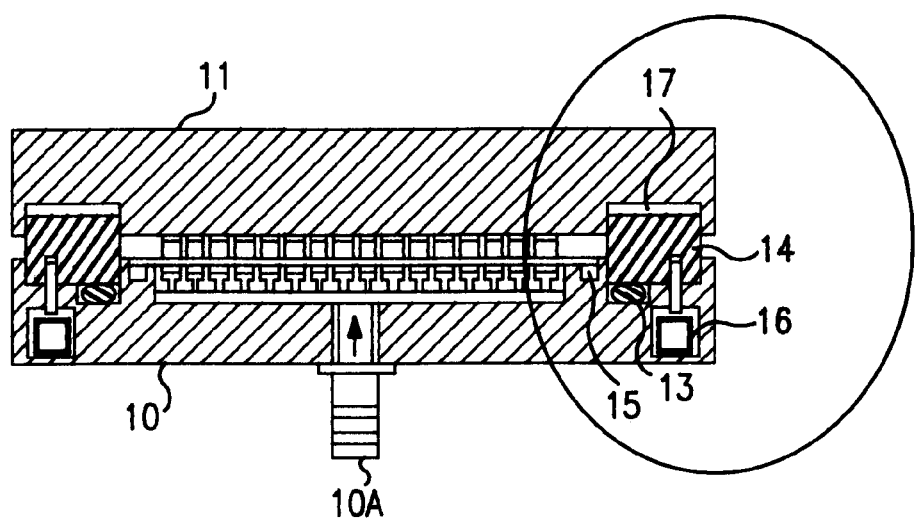
FIG. 6(b) is an alternative of FIG. 6(a), in which Metallic Bolt 16 which is applied in the Aluminum Heat Absorbing Block 11 is replaced by Adhesive 17.
Figure 7A:
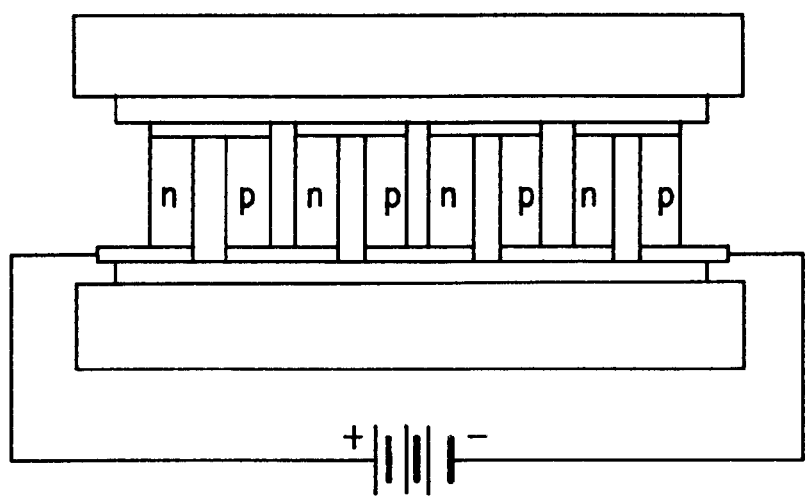
FIGS. 7(a) and (b) are a composition of conventional thermoelectric component.
Figure 7B:
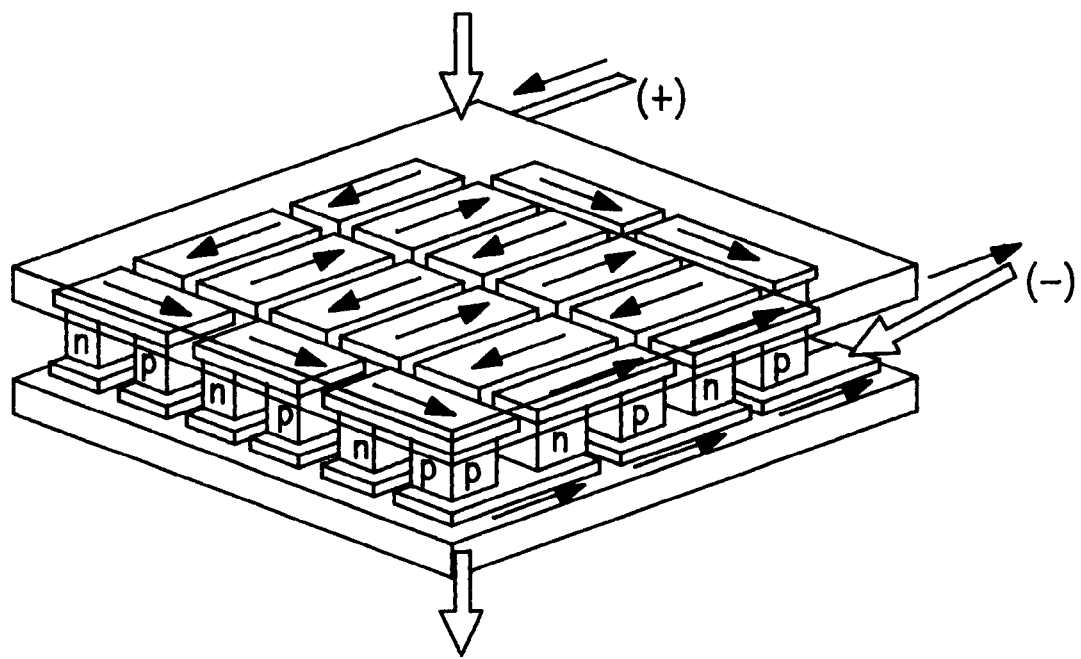
Figure 8A:
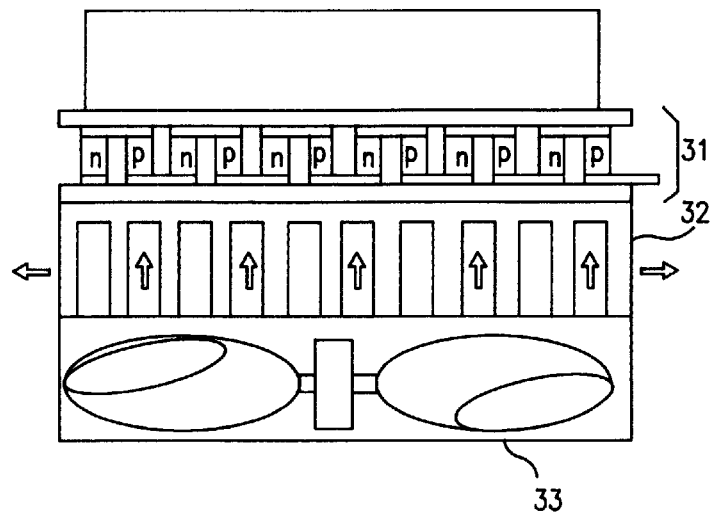
FIGS. 8(a) and (b) are a cooling system with a conventional thermoelectric component.
Figure 8B:
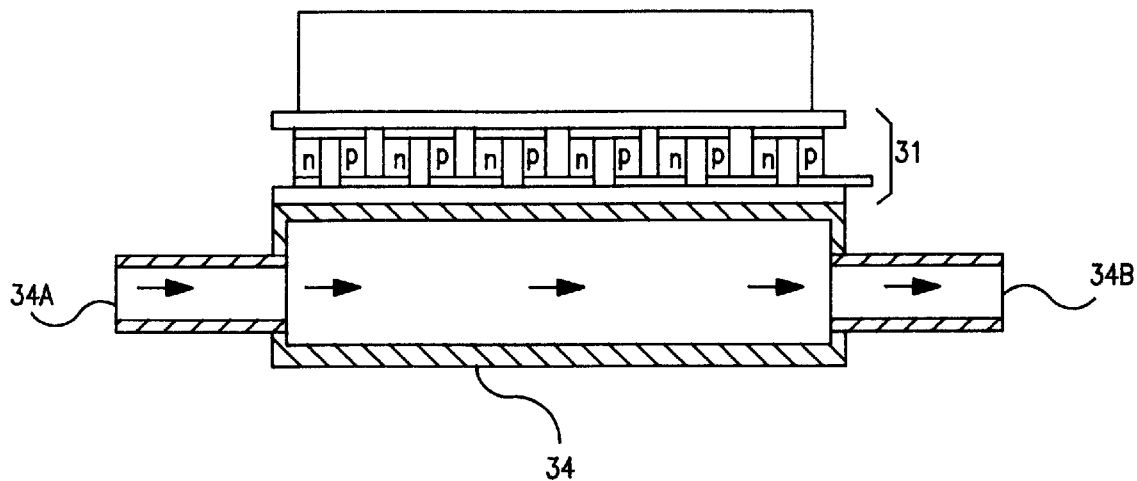

FIG. 6 shows another example of a liquid-cooling-type thermoelectric cooling unit, where the numbering system is the same for the corresponding parts as in FIG. 5. Only those figures corresponding to the B–B' sectional view in FIG. 5 are shown because the two examples do not differ except for the circled portion in FIG. 6.

FIG. 6(a) shows the connection between Baseboard 10 and the Aluminum Heat Absorbing Block 11 where the unit is fixed from both sides with Metallic Bolts 16. Because of a low thermal insulation value of Metallic Bolt 16, Insulator 14 which is larger than that in FIG. 5 is used. The Metallic Bolts 16 retain and fix Insulator 14, Baseboard 10 and Aluminum Heat Absorbing Block 11.

FIG. 6 (b) is an alternative of FIG. 6(a), where Metallic Bolt 16 which is applied in the Aluminum Heat Absorbing Block 11 is replaced by Adhesive 17.

So far in the above description, the thermoelectric component in which the thermoelectric semiconductor elements are placed into and retained by a partition plate, is constructed in the manner described in "Patent Disclosure Public Heisei 8-2228027". This type of thermoelectric component may be prepared by making rectangular parallelepiped holes on an epoxy glass board or alumetized aluminum board and placing ordinary cubic thermoelectric semiconductor elements into the holes and then attaching them with a heat curing resin such as polyamide resin.

Based on this invention described in detail as above, heat stress on thermoelectric semiconductor elements is relieved because both upper and lower metallic electrodes which are attached to thermoelectric semiconductor elements are not fixed to solid substrates. As a result, a longer life of thermoelectric semiconductor elements can be achieved. In addition, the direct cooling of thermoelectric semiconductor elements minimizes a decrease in cooling efficiency and thereby enhances the performance of the thermoelectric semiconductor elements.

I claim:

1. A thermoelectric component comprising:

a partition plate with electrical insulation;

p-type and n-type thermoelectrical semiconductor elements that are equal in number and retained with juts in the partition plate;

flat metallic electrodes connected to a cold junction of the p-type and n-type thermoelectric semiconductor elements; and T-shaped metallic electrodes connected to a hot junction of the p-type and n-type thermoelectric semiconductor elements.

2. A thermoelectric cooling device comprising:

a partition plate with electrical insulation;

p-type and n-type thermoelectric semiconductor elements that are equal in number and retained with juts in the partition plate;

flat metallic electrodes connected to a cold junction of the p-type and n-type thermoelectric semiconductor elements;

T-shape metallic electrodes connected to a hot junction of the p-type and n-type thermoelectric semiconductor elements; and a cooling container for the hot junction of the partition plate.

3. A thermoelectric cooling device according to claim 2, wherein gas is used in said cooling container.

4. A thermoelectric cooling device according to claim 2, wherein liquid is used in said cooling container.

5. A thermoelectric cooling device according to claim 4, wherein said liquid is introduced to the cooling container in a perpendicular direction to said partition.

6. A thermoelectric cooling device according to claim 4, wherein said cooling container is made of metal with an insulating layer on the surface.

7. A thermoelectric cooling device according to claim 2, wherein a metallic cooling load with an insulating layer on the surface is attached to said flat metallic electrodes.

8. A thermoelectric cooling device according to claim 7, wherein a damp-proof frame is installed around the side of said cooling load.

\* \* \* \* \*